US006284628B1

(12) United States Patent
Kuwahara et al.

(10) Patent No.: US 6,284,628 B1
(45) Date of Patent: Sep. 4, 2001

(54) METHOD OF RECYCLING A DELAMINATED WAFER AND A SILICON WAFER USED FOR THE RECYCLING

(75) Inventors: Susumu Kuwahara; Kiyoshi Mitani; Hiroji Aga, all of Gunma-ken; Masae Wada, Nagano-ken, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/295,089

(22) Filed: Apr. 20, 1999

(30) Foreign Application Priority Data

Apr. 23, 1998 (JP) .................................................. 10-131351

(51) Int. Cl.$^7$ ........................... H01L 21/30; H01L 21/46; H01L 21/31; H01L 21/469
(52) U.S. Cl. ........................ 438/459; 438/760; 438/457; 438/977; 438/959
(58) Field of Search .................................. 438/455, 458, 438/459, 465, 760; 156/636, 655

(56) References Cited

U.S. PATENT DOCUMENTS

| | | | |
|---|---|---|---|
| 5,131,979 | * 7/1992 | Lawrence | ............... 156/655 |
| 5,487,931 | * 1/1996 | Annacone et al. | .............. 428/64.1 |
| 5,855,735 | * 1/1999 | Takada et al. | ............... 156/636.1 |
| 6,064,081 | * 5/2000 | Robinson et al. | .............. 257/183 |
| 6,133,112 | * 10/2000 | Iwane et al. | ............... 438/409 |
| 6,140,211 | * 10/2000 | Nanda et al. | ............... 438/465 |
| 6,146,979 | * 11/2000 | Henley et al. | ............... 438/458 |

FOREIGN PATENT DOCUMENTS

| | | |
|---|---|---|
| 0 553 852 | 8/1993 | (EP) . |
| 0 786 801 | 7/1997 | (EP) . |
| 0 793 263 | * 9/1997 | (EP) . |
| 5211128 | 8/1993 | (JP) .......................... H01L/21/205 |
| 8-264552 | 10/1996 | (JP) . |

OTHER PUBLICATIONS

Sakaguchi, et al. "Current Progress in Epitaxial Layer Transfer," IEICE Trans. Electron. vol. E80–C No. 3, Mar. 1997, pp. 378–387.

Auberton–Herve, et al. "Smart–Cut: the Basic Fabrication Process for UNIBOND SOI Wafers," IEICE Trans. Electron. vol. E80–C No. 3, Mar. 1997, pp. 358–363.

* cited by examiner

*Primary Examiner*—John F. Niebling
*Assistant Examiner*—Viktor Simkovic
(74) *Attorney, Agent, or Firm*—Hogan & Hartson, LLP (57) ABSTRACT

There is disclosed a method of recycling a delaminated wafer produced as a by-product in producing an SOI wafer according to a hydrogen ion delaminating method by reprocessing it for reuse as a silicon wafer, wherein at least polishing of the delaminated wafer for removing of a step in the peripheral part of the delaminated wafer and heat treatment in a reducing atmosphere containing hydrogen are conducted as the reprocessing. There are provided a method of appropriately reprocessing a delaminated wafer produced as a by-product in a hydrogen ion delaminating method to reuse it as a silicon wafer actually, and particularly, a method of reprocessing an expensive wafer such as an epitaxial wafer many times for reuse, to improve productivity of SOI wafer having a high quality SOI layer, and to reduce producing cost.

14 Claims, 6 Drawing Sheets

METHOD OF RECYCLING A DELAMINATED WAFER AND A SILICON WAFER USED FOR THE RECYCLING

BACKGROUND OF THE INVENTION

1. Field of the Invention

The present invention relates to a method of recycling a silicon wafer by reprocessing a delaminated (split) wafer produced as a by-product in a hydrogen ion delaminating method (also called a smart cut method) wherein an ion-implanted wafer is bonded to another wafer and a portion of the ion-implanted wafer is delaminated to thereby obtain an SOI (silicon on insulator) wafer. Particularly, the present invention relates to a method of reprocessing the delaminated wafer many times, and reusing it many times.

2. Description of the Related Art

Conventionally, two methods have gained wide notice as methods of fabricating wafers having an SOI structure. One method is a SIMOX (separation by implanted oxygen) method in which oxygen ions are implanted into a silicon monocrystal at a high concentration, and heat treatment is then performed at a high temperature in order to form an oxide layer. The other method is a bonding method in which two mirror-polished silicon wafers are bonded together without use of adhesive, and one of the wafers is subsequently made very thin.

In the SIMOX method, the thickness of an SOI layer that becomes a device active region can be determined and controlled through adjustment of an acceleration voltage at the time of oxygen ion implantation. Therefore, the SIMOX method has an advantage of enabling easy formation of a thin SOI layer having a high uniformity of thickness. However, the SIMOX method has many problems in relation to the reliability of a buried oxide layer, the crystallinity of the SOI layer, necessity of heat treatment at a temperature of 1300° C. or higher, and the like.

Meanwhile, in the wafer bonding method, an oxide film is formed on at least one of two mirror-polished silicon single crystal wafers, which are bonded together without use of adhesive and then subjected to heat treatment (typically, at 1100–1200° C.) in order to strengthen the bonding; subsequently, one of the wafers is subjected to grinding or wet etching such that the wafer becomes a thin film, the surface of which is then mirror-polished to form an SO layer. Therefore, the reliability of the buried oxide layer is high, and the crystallinity of the SOI layer is good.

However, since the thin film is formed by means of mechanical machining, it takes long time to form the thin film, and a great portion of one of the wafers is pulverized to be lost. Therefore, productivity is extremely low, and production cost is significantly high. Furthermore, there are limits to the thickness and thickness uniformity of the resultant SOI layer in formation of the thin film by grinding and polishing by means of mechanical machining.

Furthermore, most of waters used in the wafer bonding method are CZ wafers produced by Czochralski method (CZ method). However, it has been found in recent years that there exist in the CZ wafer crystal defects called COP (Crystal Originated Particle) which are incorporated while the crystal is growing. Accordingly, when the CZ wafer is used as a bond wafer which is to be a device active layer, COP exists also in the SOI layer, and pierces through the SOI layer which is very thin as required recently to form a pin hole which extremely degrades electric characteristics of the wafer.

To solve the problem, there is proposed, for example, a method wherein CZ wafer on which an epitaxial layer is grown is bonded to other wafer on the side of the epitaxial layer, and the silicon wafer which constitutes a base is ground and polished to form a SOI layer (see Japanese Patent Application Laid-open (Kokai) No.7-254689). According to the method, the above mentioned crystal defects such as COP can be surely eliminated. However, since it is necessary to use an expensive epitaxial wafer, production cost of the SOI wafer gets far higher.

When FZ wafer is used, there is no problem in relation to defects due to oxygen or the above mentioned COP, since no oxygen is contained in the FZ wafer. However, since only one SOI wafer can be obtained from two silicon wafers, there still exists the problem of high production cost.

In the wafer bonding method, not only silicon wafers are bonded together, but also a silicon wafer may be bonded directly to an insulator wafer of $SiO_2$, SiC, $Al_2O_3$ or the like, in order to form an SOI layer.

Recently, public attention has been drawn to a new method of fabricating an SOI wafer in which an ion-implanted wafer is bonded to another wafer and a portion of the ion-implanted wafer is delaminated (split) to thereby obtain an SOI wafer (hydrogen ion delaminating method: so-called smart-cut method). In this method, an oxide film is formed on the surface of at least one of two silicon wafers; and hydrogen ions or rare gas ions are implanted into the surface of one of the two silicon wafers in order to form a fine bubble layer (enclosed layer) within the wafer; the ion-implanted silicon wafer is superposed on the other silicon wafer such that the ion-implanted surface comes into close contact with the surface of the other silicon wafer via the oxide film; heat treatment is performed to delaminate a portion of the ion-implanted wafer while the fine bubble layer is used as a delaminating plane, in order to form a thin film; and heat treatment (bonding heat treatment) is further performed to firmly bond the thin film and the other wafer, to thereby obtain an SOI wafer (see Japanese Patent Application Laid-Open (kokai) No. 5-211128 or U.S. Pat. No. 5,374,564). Also, in this method, since the surface formed as a result of delamination is a good mirror-like surface, an SOI wafer whose SOI layer has a high thickness uniformity is obtained with relative ease.

Also in the hydrogen ion delaminating method described above, not only silicon wafers are bonded together, but also an ion-implanted silicon wafer may be bonded directly to an insulator wafer of $SiO_2$, SiC, $Al_2O_3$, etc., in order to form an SOI layer.

When the SOI wafer is fabricated by the hydrogen ion delaminating method, a silicon delaminated wafer is inevitably produced as a by-product. It has been proposed to reuse such a delaminated wafer as a by-product so that one SOI wafer can be obtained substantially from one silicon wafer, and thereby to reduce production cost significantly.

It is conceptually possible to reuse the delaminated wafer, but there has been no actual cases of reusing the delaminated wafer, and the specific means for reusing it has not yet been known. The inventors of the present invention have studied and found that the wafer as just delaminated cannot be reused for the following reasons: a step is present in the peripheral part of the wafer; a damage layer due to ion implantation is present on the surface thereof; and surface roughness thereof is large. Accordingly, it is necessary to remove the step in the peripheral part of the wafer, the damage layer, or the like, in order to reuse the delaminated wafer as a silicon wafer.

In this case, it may be conceived that the surface of the delaminated wafer is ground, and then polished in order to remove the step in the peripheral part and the damage layer, and to improve surface roughness or the like. However, in order to improve the surface properties by grinding and polishing, long processing time and a lot of stock removal are required. Moreover, in the case that an epitaxial layer is used as a bond wafer in the hydrogen ion delimitation method, and SOI layer is made of an epitaxial layer, since the epitaxial layer remaining on the delaminated layer is completely removed, the epitaxial layer cannot be reused as a SOI layer. Accordingly, cost for fabrication of SOI wafer cannot be reduced.

In the case that CZ wafer is used as a bond wafer, the problems in relation to the above-mentioned COP cannot be solved by grinding and polishing. In the case that FZ wafer is used as a bond wafer, a lot of stock removal in grinding or polishing means the small number of times of reuse, and further, long processing time, and high production cost.

SUMMARY OF THE INVENTION

The present invention has been accomplished to solve the above-mentioned problems, and an object of the present invention is to provide a method of appropriately reprocessing a delaminated wafer produced as a by-product in a hydrogen ion delaminating method to reuse it as a silicon wafer actually. Particularly, the object of the present invention is to provide a method of reprocessing an expensive wafer such as an epitaxial wafer many times for reuse, to improve productivity of SOI wafer having a high quality SOI layer, and to reduce producing cost.

To achieve the above object, the present invention provides a method of recycling a delaminated wafer produced as a by-product in producing an SOI wafer according to a hydrogen ion delaminating method by reprocessing it for reuse as a silicon wafer wherein polishing of the delaminated wafer for removing of a step in the peripheral part of the delaminated wafer and heat treatment in a reducing atmosphere containing hydrogen are at least conducted as the reprocessing.

As described above, it has been found that there is a step in the peripheral part of the delaminated wafer produced as a by-product. According to the method of the present invention, the step in the peripheral part of the delaminated wafer is removed by polishing as reprocessing. With polishing for removal of the step in the peripheral part of the delaminated wafer, the peripheral step can be easily removed, and moreover, the damage layer on the surface of the delaminated wafer can also be removed, and the surface roughness can also be improved at the same time.

Basically, polishing is conducted only to the stock removal necessary for removal of the step in the peripheral part in the present invention. Removal of the damage layer remaining on the surface and improvement of the surface roughness are achieved by the heat treatment for the delaminated wafer in a reducing atmosphere containing hydrogen.

The present invention also provides a method of recycling a delaminated wafer produced as a by-product in producing an SOI wafer according to a hydrogen ion delaminating method in which an epitaxial wafer is used as a bond wafer by reprocessing it for reuse as a silicon wafer wherein polishing of the delaminated wafer for removal of a step in the peripheral part of the delaminated wafer and heat treatment in a reducing atmosphere containing hydrogen are at least conducted as the reprocessing.

As described above, since the stock removal is kept to a minimum to reprocess the delaminated wafer in the method of the present invention, the epitaxial layer of the expensive epitaxial wafer can be reprocessed and reused many times, so that the SOI wafer of high quality can be fabricated at low cost.

Furthermore, the present invention also provides a method of recycling a delaminated wafer produced as a by-product in producing an SOI wafer according to a hydrogen ion delaminating method in which CZ wafer is used as a bond wafer by reprocessing it for reuse as a silicon wafer wherein polishing of the delaminated wafer for removing of a step in the peripheral part of the delaminated wafer and heat treatment in a reducing atmosphere containing hydrogen are at least conducted as the reprocessing.

As described above, since the delaminated wafer is subjected to the heat treatment in a reducing atmosphere containing hydrogen in the method of the present invention, a damage layer on the surface of the delaminated wafer can be removed, the surface roughness can be improved, and further, COPs in CZ wafer can be eliminated. Accordingly, in the case that CZ wafer is used as a bond wafer in a hydrogen ion delamination method, and a delaminated wafer is CZ wafer, the recycled (reclaimed) wafer in which COPs in the delaminated wafer are eliminated can be obtained.

Moreover, the present invention provides a method of recycling a delaminated wafer produced as a by-product in producing an SOI wafer according to a hydrogen ion delaminating method in which FZ wafer is used as a bond wafer by reprocessing it for reuse as a silicon wafer wherein polishing of the delaminated wafer for removing of a step in the peripheral part of the delaminated wafer and heat treatment in a reducing atmosphere containing hydrogen are at least conducted as the reprocessing.

As described above, since the stock removal is kept to a minimum to reprocess the delaminated wafer in the method of the present invention, the FZ wafer having no COP can be reprocessed many times to be reused, so that the SOI wafer having high quality can be fabricated at low cost.

It is preferable that a surface oxide film is removed before polishing for removal of a step in the peripheral part, as reprocessing of delaminated wafer.

When the surface oxide film is removed before polishing for removal of the peripheral step, the polishing can be conducted uniformly. Namely, when the oxide film is present on the peripheral part having the step, the step will be larger. Furthermore, since the oxide film and the silicon are different in hardness, uniform polishing is difficult in the presence of the oxide film.

A stock removal in polishing for removal of the step in the peripheral part as reprocessing of the delaminated wafer is preferably 1 to 2 $\mu$m.

With such a small stock removal, the peripheral step can be surely removed. Furthermore, since the stock removal is small, the epitaxial layer can be used as the SOI layer many times by reprocessing the delaminated wafer, even when the epitaxial wafer is used as a bond wafer.

It is preferable that the heat treatment in a reducing atmosphere containing hydrogen as reprocessing of the delaminated wafer is performed at a temperature in the range from 1000° C. to a melting point of silicon, for 6 hours or less.

When the heat treatment is performed under such a condition, namely at high temperature for a long time, the damage layer on the surface can be removed and surface roughness can be improved surely. Furthermore, the heat treatment in a reducing atmosphere containing hydrogen can be performed through use of a conventional resistance heating furnace.

In another embodiment of the present invention, the heat treatment as reprocessing of the delaminated wafer in a reducing atmosphere containing hydrogen is performed at a temperature in the range from 1000° C. to a melting point of silicon for 1 to 300 seconds through use of a rapid heating/rapid cooling apparatus.

When the delaminated wafer is subjected to the heat treatment in a reducing atmosphere containing hydrogen through use of the rapid heating/rapid cooling apparatus as mentioned above, removal of a damage layer on the surface of the delaminated wafer and improvement of surface roughness thereof can be achieved efficiently in a very short time.

In another embodiment of the present invention, the heat treatment as reprocessing of the delaminated wafer in a reducing atmosphere containing hydrogen is performed in 100% hydrogen atmosphere or a mixed atmosphere of hydrogen and argon.

In such an atmosphere for the heat treatment, the surface of the delaminated wafer can be surely improved.

As described above, the delaminated wafer reprocessed according to the present invention has high quality, namely, the peripheral step can be removed, the damage layer can be removed and the surface roughness can be improved therein. Therefore, it can be used as various silicon wafers.

Particularly, according to the present invention, since the stock removal can be decreased, the reprocessed wafer can be reused as a bond wafer of the SOI wafer, and thereby the delaminated wafer can be reused for fabrication of the SOI wafer many times.

The present invention also provides a silicon wafer to be reused, which is obtained according to the above-mentioned methods of reprocessing.

As described above, the delaminated wafer reprocessed according to the present invention can be reused as a silicon wafer. Particularly, since the stock removal for reprocessing according to the present invention is very small, it is not always necessary to previously control thickness of the wafer to be delaminated in the hydrogen ion delaminating method. Accordingly, recycling of the delaminated wafer can be conducted quite easily and conveniently.

As described above, when the delaminated wafer produced as a by-product in the hydrogen ion delaminating method is reprocessed appropriately according to the present invention, it can be actually reused as a silicon wafer. Particularly, the stock removal of the delaminated wafer can be decreased, an expensive wafer such as an epitaxial wafer can be reprocessed many times to be reused many times. Thereby, improvement in productivity of the SOI wafer having the SOI layer of high quality and cost reduction can be achieved.

BRIEF DESCRIPTION OF THE DRAWINGS

FIGS. 1(a)–(h) is a flowchart showing an example of an SOI-wafer fabricating process according to a hydrogen ion delaminating method.

FIGS. 2(A)–(F) is a flowchart showing a method of reprocessing a delaminated wafer for reuse of the present invention, employed in an example.

DESCRIPTION OF THE INVENTION AND A PREFERRED EMBODIMENT

The present invention will be further described below in detail, referring to the drawings, but is not limited thereto.

The present invention will be hereunder explained mainly as for a method of producing SOI wafer by bonding two silicon wafers.

Figure 1:
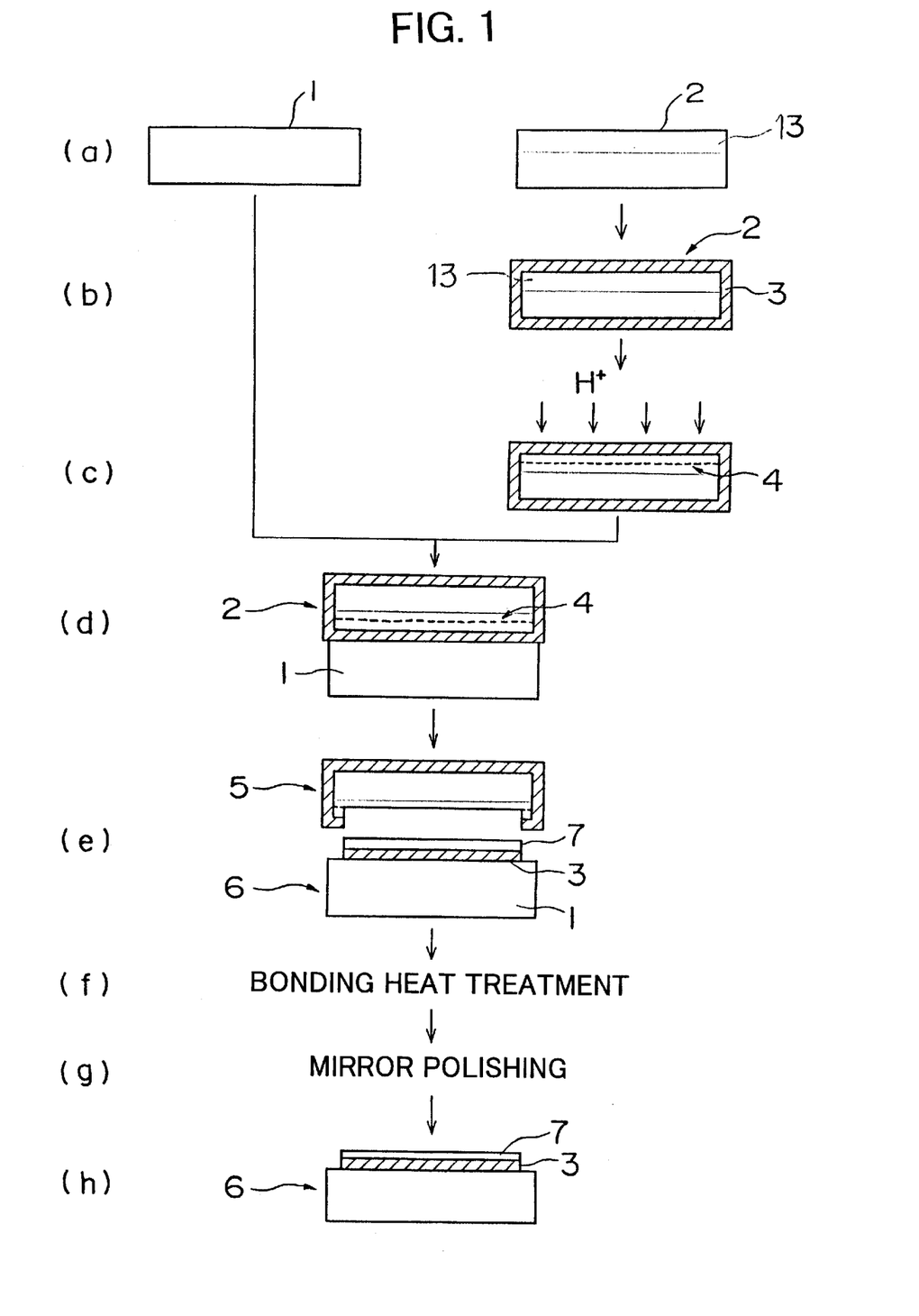

In step (a) of the hydrogen ion delaminating method shown in FIG. 1, two silicon wafers, namely a base wafer 1 to be a base and a bond wafer 2 to be an SOI layer which are suitable for device specifications are prepared. In this embodiment, an epitaxial wafer consisting of a silicon mirror wafer on which an epitaxial layer 13 having a thickness of about 10 µm was grown is employed as a bond wafer 2.

In step (b), at least one of the wafers, the bond wafer (epitaxial wafer) 2 in this case is subjected to thermal oxidation so as to form on the surface thereof an oxide film 3 having a thickness of about 0.1 µm to 2.0 µm.

In step (c), hydrogen ions or rare gas ions are implanted into one surface, on which the epitaxial layer is formed, of the bond wafer 2 on which oxide film is formed, in order to form a fine bubble layer (enclosed layer) 4 which extends in parallel to the surface at a position corresponding to the mean penetration depth of ion implantation. The implantation temperature is preferably 25–450° C.

In step (d), the base wafer 1 is superposed on the hydrogen ion-implanted surface (the epitaxial layer formed surface) of the hydrogen ion-implanted bond wafer 2 via the oxide film, and they are brought in close contact with each other. When the surfaces of the two wafers are brought into contact with each other at ambient temperature in a clean atmosphere, the wafers adhere to each other without use of adhesive or the like.

In step (e), there is performed a heat treatment for delamination in which a delaminated wafer 5 is delaminated from an SOI wafer 6 (composed of the SOI layer 7, a buried oxide layer 3, and a base wafer 1) while the enclosed layer 4 is used as a delaminating plane. The heat treatment is performed, for example, at a temperature of about 500° C. or higher in an inert gas atmosphere so as to cause crystal rearrangement and bubble cohesion, and thereby the delaminated wafer 5 is delaminated from the SOI wafer 6. In this case all of the SOI layer 7 is made of an epitaxial layer.

In step (f), the SOI wafer 6 is subjected to heat treatment at high temperature as bonding heat treatment to achieve sufficient bonding strength, since the bonding strength imparted in the closely contacting step (d) and the delaminating heat treatment step (e) described above is not sufficient to be used without further treatment in a device process. Preferably, this heat treatment is performed, for example, in an inert gas atmosphere at 1050–1200° C. for 30 minutes to 2 hours.

Step (e), i.e. the delaminating heat treatment and step (f), i.e. the bonding heat treatment can be conducted successively. Alternatively, step (e), i.e. the delaminating heat treatment he can also serve as a bonding heat treatment of step (f).

In step (g), a mirror polishing process called touch polishing wherein a stock removal is very small is then performed to remove a crystal defect layer on a delaminated surface which is a surface of the SOI layer 7 and improve the surface roughness.

The SOI wafer 6 of high quality having the SOI layer 7 consisting of an epitaxial layer of high crystal quality and high thickness uniformity can be produced (step (h)) through the steps described above.

In the above hydrogen ion delaminating method, the delaminated wafer 5 is produced as a by-product in the step (e) of FIG. 1. The thickness of the SOI layer produced by the hydrogen ion delaminating method is generally 0.1 to 1.5 microns, and 2 microns at the thickest. Accordingly, the delaminated wafer 5 has a sufficient thickness. Therefore, production cost for the SOI layer can be significantly reduced by reusing the delaminated wafer as a silicon wafer. Particularly, when the epitaxial wafer having the epitaxial layer with thickness of about 10 microns is used as a bond wafer as in the above-mentioned embodiment, the epitaxial layer with thickness of about 8 microns or more remains after delamination. Accordingly, if it can be used as a bond wafer again, production cost for the SOI wafer wherein the epitaxial wafer is used can be significantly reduced.

Figure 2:
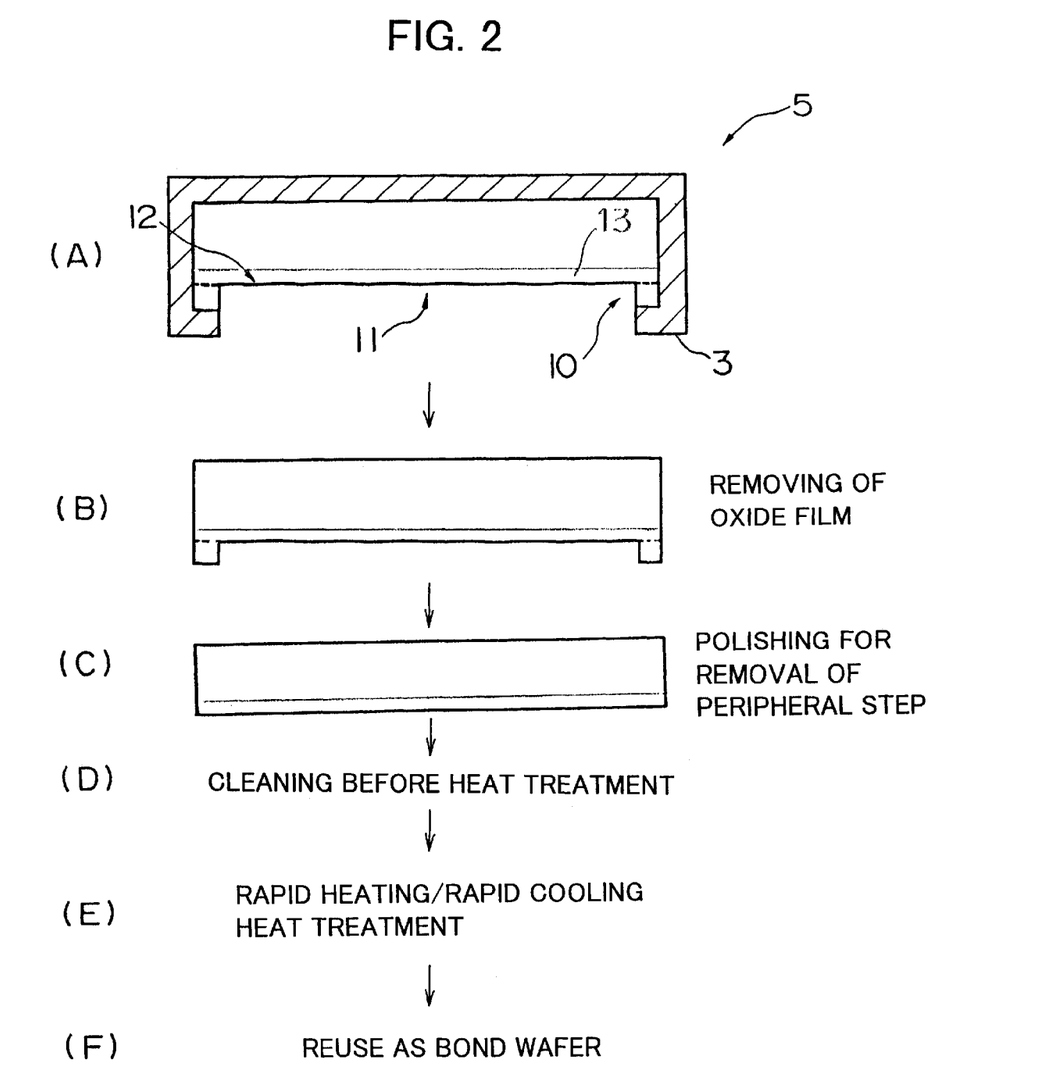

However, a step 10 is formed in the peripheral part of the delaminated wafer 5 as shown in the enlarged schematic view of the delaminated wafer of FIG. 2(A), and therefore, the wafer cannot be used as a silicon wafer without processing further. The peripheral step 10 is formed because the periphery of the bond wafer cannot be bonded to a base wafer. Accordingly, the height of the step is approximately the same as the sum of the thickness of the SOI layer and the thickness of the buried oxide layer 3.

Furthermore, the damage layer 12 due to hydrogen ion implantation remains on the delaminated surface 11 of the delaminated wafer, and the surface roughness is worse than that of a general mirror wafer. Particularly, the surface roughness is locally inferior. Accordingly, when the wafer is subjected to preferential etching such as alkali etching, deep pits are formed therein.

In that case, it would be conceived that all of the peripheral step, the damage layer and the surface roughness is removed by grinding and polishing. However, stock removal will be too much, and processing time will be too long in such a method. Furthermore, in the case that the epitaxial wafer is used as a bond wafer as in the above-mentioned embodiment, the epitaxial layer will be completely removed, and therefore it will not be able to be reused as an SOI layer.

In order to solve the above-mentioned problems, the inventors have studied a method wherein a delaminated wafer produced as a by-product in a hydrogen ion delamination method is reprocessed appropriately to be actually reused as a silicon wafer, and completed the present invention.

In particular, the inventors studied a method wherein a stock removal for reprocessing a delaminated wafer is reduced in order to reprocess and to reuse an expensive wafer with high quality, such as the above-mentioned epitaxial wafer, many times.

Namely, according to the present invention, the peripheral step formed on the delaminated wafer produced as a by-product in fabrication of an SOI wafer by the hydrogen ion delaminating method is removed by being polished slightly.

As described above, when the peripheral step in the delaminated wafer is removed by polishing, the peripheral step can be easily removed. For example, when the thickness of the SOI layer is 0.2 micron, a stock removal of about 1 micron will be enough to remove the step completely. Even when the SOI layer is thicker, a stock removal of 2 microns will be enough to remove the peripheral step.

Furthermore, when the peripheral step is removed by polishing, removal of the damage layer and improvement of the surface roughness on the delaminated wafer can also be achieved in some extent at the same time.

In the method of the present invention, a surface oxide film 3 is preferably removed in reprocessing of the delaminated wafer before the polishing for removal of the peripheral step.

Because, when the surface oxide film 3 is removed before polishing for removal of the peripheral step 10, the polishing can be performed uniformly. When the oxide film 3 is deposited on the peripheral step 10, the height of the step is higher, and uniform polishing in the surface of the delaminated wafer is difficult because of the difference in hardness between the oxide film and silicon.

The removal of the oxide film can be easily performed by dipping the delaminated wafer into hydrofluoric acid.

Next, in the present invention, the delaminated wafer is subjected to the heat treatment in a reducing atmosphere containing hydrogen in order to improve the surface roughness completely. Because, when the finish polishing is performed after polishing for removal of the peripheral step, the stock removal will be increased. Therefore, improvement of the surface roughness and removal of the damage layer are achieved by subjecting the delaminated wafer to the heat treatment in a reducing atmosphere containing hydrogen as reprocessing for the delaminated wafer in the present invention.

The heat treatment can remove the damage layer and improve the surface roughness without decreasing the thickness of the delaminated wafer. Accordingly, the stock removal in reprocessing can be basically kept within the amount which is necessary for removal of the peripheral step.

In that case, the order of the polishing for removal of the peripheral step and the heat treatment in a reducing atmosphere containing hydrogen is not necessary to be specific. It is preferable to remove the peripheral step before the heat treatment, namely to perform the heat treatment after removal of the surface damage layer and the surface roughness in some extent, since in that case the damage layer can be removed more completely, and the surface roughness can be further improved. However, it doesn't matter if the polishing for removal of the peripheral step is performed after the heat treatment in a reducing atmosphere containing hydrogen.

The heat treatment in a reducing atmosphere containing hydrogen in the present invention can be conducted preferably, for example, at 1000° C. to a melting point of silicon, more preferably at 1200 to 1350° C., for 6 hours or less.

When the high temperature heat treatment is conducted for a long time under the above-mentioned condition, it is possible to surely remove the damage layer on the surface of the delaminated wafer and to improve the surface roughness with any type of heat treatment furnace. The heat treatment at a high temperature such as 1200° C. or more makes it possible to remove the damage layer efficiently and to improve the surface roughness. However, heat treatment at a temperature higher than 1350° C. may cause problems in relation to durability of a furnace and wafer contamination. Accordingly, the heat treatment at a temperature of 1200° C. to 1350° C. is preferable.

However, the heat treatment using a general heat treatment furnace such as described above takes long time. Accordingly, the heat treatment of the present invention can be conducted through use of a rapid heating/rapid cooling apparatus at a temperature in the range from 1000° C. to the melting point of silicon for 1 to 300 seconds.

When the delaminated wafer is subjected to the heat treatment in a reducing atmosphere containing hydrogen through use of the rapid heating/rapid cooling apparatus as described above, the damage layer on the surface of the delaminated wafer can be removed and the surface roughness can be improved efficiently in very short time. Temperature in the range from 1200° C. to 1350° C. is more effective also in this case.

Examples of an apparatus which can heat and cool the delaminated wafer rapidly, used in the present invention include: an apparatus heater such as a lamp heater with heat radiating. An example of commercially available apparatuses is SHS-2800 (product of AST corp.). These apparatuses are neither extremely complicated nor expensive.

Figure 6:
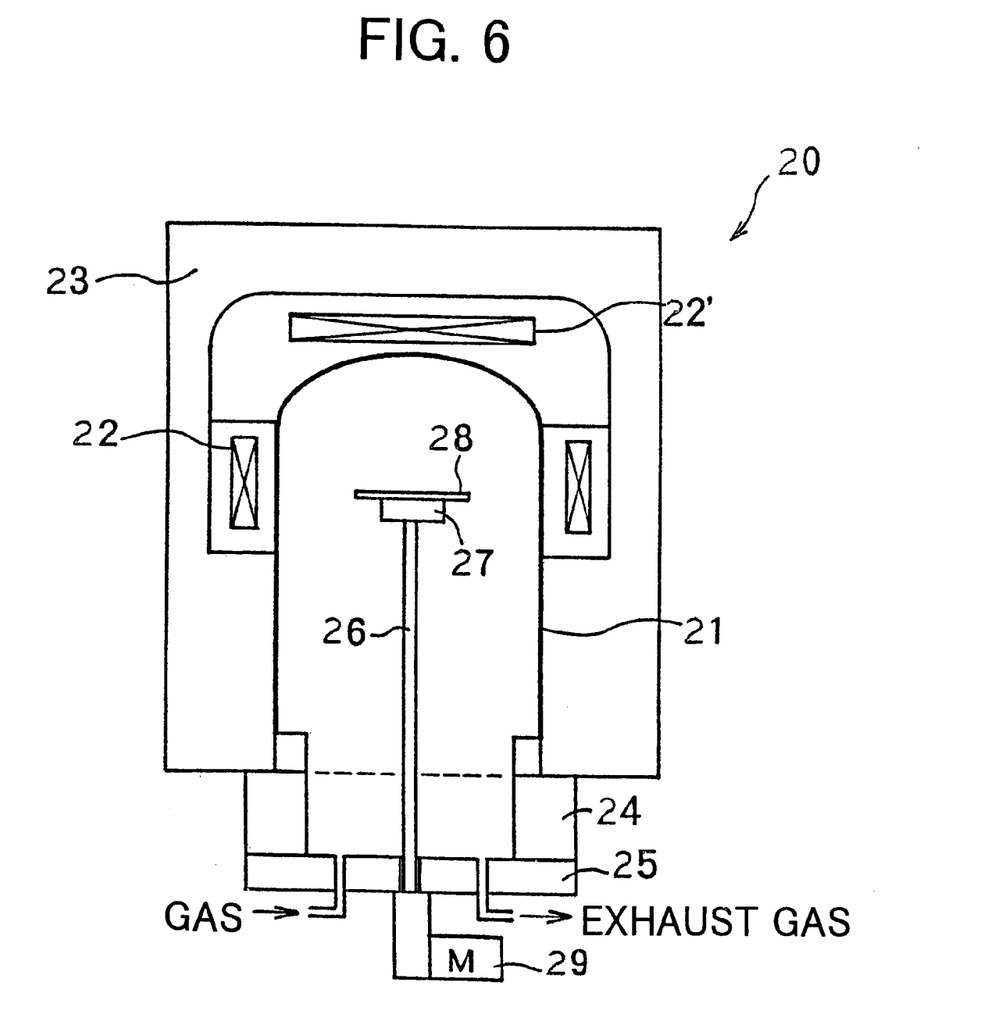
FIG. 6 is a schematic view of an example of a rapid heating/rapid cooling apparatus.

One example of the apparatus which can heat and cool the delaminated wafer rapidly, used in the present invention will be given below. FIG. 6 is a schematic sectional view of the rapid heating/rapid cooling apparatus.

A heat-treatment apparatus 20 shown in FIG. 6 includes a bell jar 21 which is formed from, for example, silicon carbide or quarts and in which a wafer is heat-treated. Heating is performed with heaters 22 and 22' surrounding the bell jar 21. The heaters are separated into the upper one and the lower one, so that power supplied to each of the heaters can be controlled independently. The heating method is not limited thereto, but so-called radiation heating and high-frequency heating may also be applicable. A housing 23 for heat shield is disposed around the heaters 22 and 22'.

A water-cooled chamber 24 and a base plate 25 are arranged at the lower portion of a furnace so as to isolate the interior of the bell jar 21 from the atmosphere. A delaminated wafer 28 is held on a stage 27, which is attached to the top end of a support shaft 26 capable of being moved vertically by means of a motor 29. In order to load a wafer into or unload it from the furnace along a horizontal direction, the water-cooled chamber 24 has an unillustrated wafer port which is opened and closed by means of a gate valve. A gas inlet and a gas outlet are provided in the base plate 25 so that the gas atmosphere within the furnace can be adjusted.

In the heat treatment furnace 20 having the above-described structure, the heat treatment for rapid heating/rapid cooling of the delaminated wafer is carried out in the procedure described below.

First, the interior of the bell jar 21 is heated to a desired temperature of 1000° C. to the melting point of silicon by the heaters 22 and 22' and is then held at the desired temperature. Through mutually independent control on power supplied to the heaters 22 and 22', a temperature distribution can be established within the bell jar 21 along a vertical direction. Accordingly, the heat-treatment temperature of a wafer is determined by the position of the stage 27, i.e. the amount of insertion of the support shaft 26 into the furnace. Heat treatment atmosphere is controlled by introducing a reducing gas containing hydrogen from the gas inlet provided in the base plate.

In a state in which the interior of the bell jar 21 is maintained at a desired temperature, a delaminated wafer is inserted into the water-cooled chamber 24 through the wafer port by an unillustrated wafer handling apparatus arranged next to the heat treatment apparatus 20. The inserted wafer is placed in, for example, a SiC boat provided on the stage 27 which is situated at the bottom standby position. Since the water-cooled chamber 24 and the base plate 25 are water-cooled, the wafer located at this standby position is not heated to a high temperature.

Upon completion of placing the delaminated wafer on the stage 27, the motor 29 is immediately driven to insert the support shaft 26 into the furnace so that the stage 27 is raised to a heat treatment position where a desired temperature in the range of 1000° C. to a melting point of silicon is established, thereby heat-treating the delaminated wafer on the stage at the high temperature. In this case, since only approximately 20 seconds, for example, is required for moving the stage 27 from the bottom standby position in the water-cooled chamber 24 to the heat treatment position, the delaminated wafer is heated quickly.

The stage 27 is halted at the desired temperature position for a predetermined time (1 to 300 seconds), thereby subjecting the delaminated wafer to high-temperature heat treatment over the halting time in a reducing atmosphere. Upon elapse of the predetermined time to complete high-temperature heat treatment, the motor 29 is immediately driven to withdraw the support shaft 26 from the interior of the furnace to thereby lower the stage 27 to the bottom standby position in the water-cooled chamber 24. This lowering motion can be completed in approximately 20 seconds, for example. The delaminated wafer on the stage 27 is quickly cooled, since the water-cooled chamber 24 and the base plate 25 are water-cooled. Finally, the delaminated wafer is unloaded from inside the water-cooled chamber 24 by the wafer handling apparatus, thus completing the heat treatment.

When there are more delaminated wafers to be heat-treated, these wafers can be sequentially loaded into and heat-treated in the heat treatment furnace 20 maintained at a predetermined high temperature without lowering temperature.

In this case, atmosphere of the heat treatment in reducing atmosphere containing hydrogen can be a 100% hydrogen atmosphere or a mixed atmosphere of hydrogen and argon.

In the above-mentioned atmosphere for the heat treatment, a film which is harmful for the surface of the delaminated wafer is not formed, a damage layer on the surface of the delaminated wafer can be surely removed, and the surface roughness can be improved.

There can be thus obtained the recycled (reclaimed) after wherein the peripheral step of the delaminated wafer and the damage layer due to hydrogen ion implantation on the delaminated surface can be removed, and the surface roughness of the delaminated surface can be improved, so that the surface thereof is not inferior to that of the general mirror wafer.

Particularly, according to the present invention, thickness of the delaminated wafer is decreased only by 1 micron, or by 2 microns at thickest, so that the wafer itself can be reused as a bond wafer.

Namely, for example, when the SOI wafer is produced by the hydrogen ion delaminating method using the epitaxial wafer as a bond wafer, and the delaminated wafer produced as a by-product is reprocessed according to the present invention to reproduce an epitaxial wafer, the epitaxial wafer thus obtained can be reused as a bond wafer, so that the epitaxial layer of the expensive epitaxial wafer can be reprocessed many times to be reused as a SOI layer. Accordingly, a SOI wafer having high quality can be obtained at low cost.

Furthermore, when the delaminated wafer produced as a by-product in producing an SOI wafer according to a hydrogen ion delaminating method in which CZ wafer is used as a bond wafer is reprocessed according to the present invention to produce a silicon wafer, a damage layer on the surface of the delaminated wafer can be removed, the surface roughness can be improved, and further, COPs in CZ wafer can be eliminated in the resultant wafer, since the wafer is subjected to the heat treatment in a reducing atmosphere containing hydrogen. Accordingly, in the case that CZ wafer is used as a bond wafer, and a delaminated wafer is CZ wafer in the hydrogen ion delaminating method, the recycle (reclaimed) wafer wherein COPs in the delaminated wafer are also eliminated can be obtained.

Moreover, when the delaminated wafer produced as a by-product in producing an SOI wafer according to a hydrogen ion delaminating method in which FZ wafer is used as a bond wafer is reprocessed according to the present invention to produce a silicon wafer, the FZ wafer having no COP can be reprocessed many time for reuse, since the stock removal for the delaminated wafer is kept to a minimum, so that the SOI wafer having high quality can be fabricated at low cost.

The silicon wafer thus reprocessed according to the present invention can be used not only as a bond wafer again, but also as a base wafer, or as a general silicon mirror wafer. Namely use of the recycled (reclaimed) wafer obtained by the present invention is not limited specifically.

Particularly, when the epitaxial wafer is used as a bond wafer, the resultant delaminated wafer can also be used as a general epitaxial wafer.

EXAMPLE

The following examples are being submitted to further explain the present invention. These examples are not intended to limit the scope of the present invention.

Example 1

Two silicon mirror wafers having resistivity of 1.0 to 2.0 Ω·cm and a diameter of 150 mm wherein a conductive type is p type were prepared. As for one of these wafers, an epitaxial layer having a thickness of about 10 microns was grown. The epitaxial wafer was used as a bond wafer, and processed through steps (a) to (h) shown in FIG. 1 according to the hydrogen ion delaminating method to fabricate SOI wafers. Thickness of SOI layer was 0.2 micron. The major process conditions used in the method were as follows.
1) Thickness of a buried oxide layer: 400 nm (0.4 micron);
2) Conditions of hydrogen implantation: $H^+$ions, implantation energy of 69 keV, implantation dose of $5.5 \times 10^{16}/cm^2$;
3) Conditions of heat treatment for delamination: in a $N_2$ gas atmosphere, at 500° C. for 30 minutes.
4) Conditions of heat treatment for bonding: in a $N_2$ gas atmosphere, at 1100° C. for 2 hours.

The high quality SOI wafer having the SOI layer of the epitaxial layer with thickness of 0.2 micron could be thus obtained, and the delaminated wafer 5 was also produced as a by-product in step (e) of FIG. 1.

The delaminated wafer was reprocessed in accordance with the step (A) to (F) of FIG. 2 in order to be reused as a bond wafer.

Figure 3:
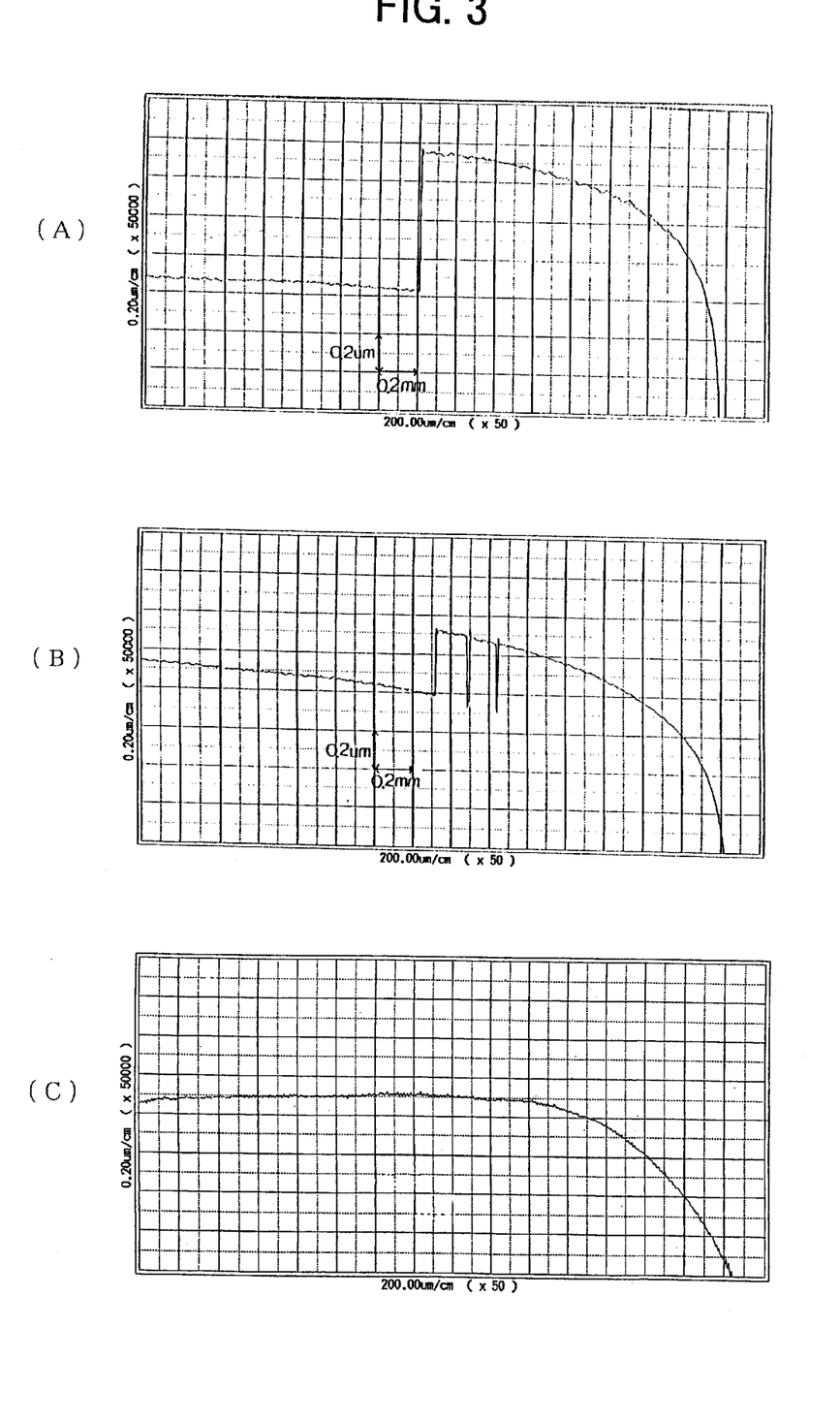
FIG. 3 is a graph showing a result of measurement of a peripheral step of a delaminated wafer.
  (A) shows a delaminated wafer which is not processed,
  (B) shows a delaminated wafer after an oxide film is removed, and
  (C) shows a delaminated wafer after a peripheral step is removed.

First, the peripheral shape of the unprocessed delaminated wafer 5 shown in FIG. 2(A) was measured by being scanned with a contact probe type roughness meter. The results of the measurement was shown in FIG. 3(A).

As shown in FIG. 3(A), there was formed a step 10 in the peripheral part of the delaminated wafer 5 due to the part at which the wafers were not bonded on bonding of the wafers. Height of the peripheral step 10 was more than the sum of thickness of the SOI layer (0.2 micron) and thickness of the oxide film layer (0.4 micron).

The surface roughness of the delaminated surface 11 of the unprocessed delaminated wafer 5 shown in FIG. 2(A) as measured by a phase shift interferometry method at 250 microns square and by an atomic force microscope method at 1 micron square was 0.40 nm on the average and 7.4 nm on average respectively (RMS value: root mean square roughness).

The values were far worse than that of a general mirror polished silicon wafer. Particularly, the value at 1 micron square is 10 times or more that of the general mirror polished silicon wafer, which shows that the surface roughness on the delaminated surface is locally large.

Depth of a damage layer on the delaminated surface 11 of the unprocessed delaminated wafer 5 shown in FIG. 2(A) was determined as follows. The wafers were subjected to etching with KOH aqueous solution at a different etching removal. The wafers were then subjected to pyrogenic oxidation at 1100° C. for one hour, and the oxide film formed on the surface was removed with an aqueous solution of hydrofluoric acid. Subsequently, the surface thereof was then subjected to preferential etching with Secco etching solution, and observed with a microscope to measure a density of OSF (oxidation induced stacking fault) existing on the surface. Each etching removal was 0, 25, 50, 75, 100, 150, 200 nm. The results of measurement was shown as a curved line a in FIG. 5.

Figure 5:
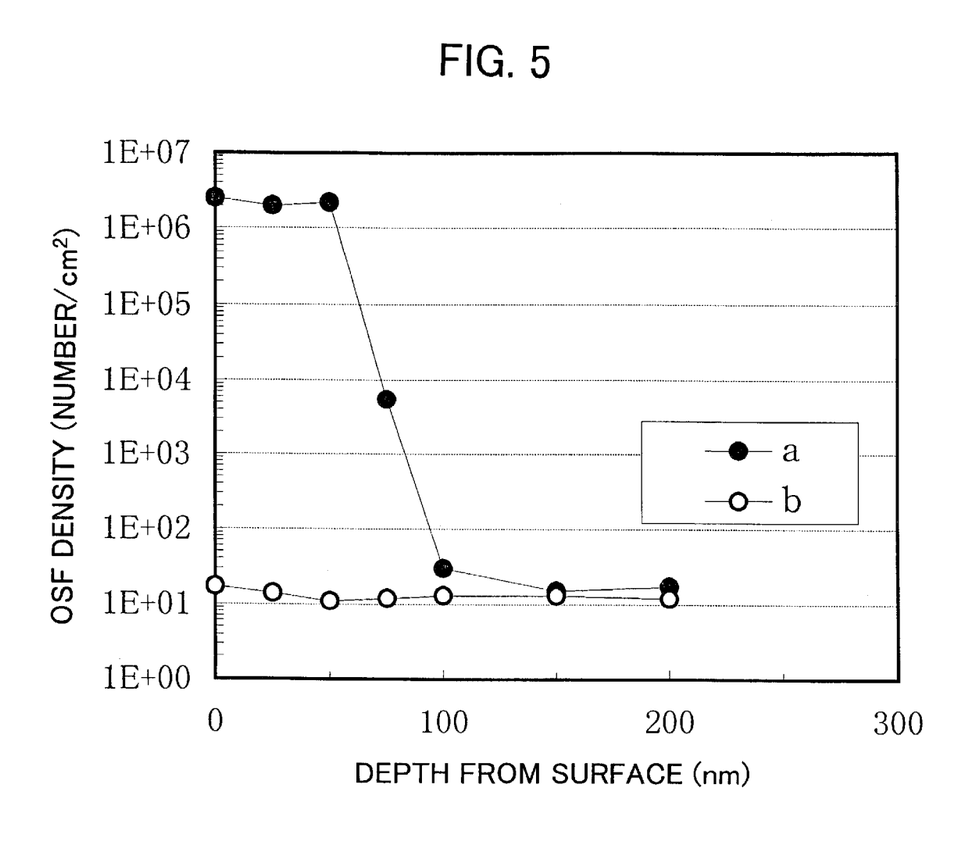
FIG. 5 is a graph showing a result of measurement of a damage layer of the delaminated wafer.

As shown in FIG. 5, it is apparent that a damage layer having a depth of about 100 nm exists on the surface of the delaminated wafer. OSFs observed in a position deeper than 100 nm were likely generated as a result that nuclei of OSF was formed in the epitaxial layer due to crystal defects which have been originally present in the substrate itself.

In FIG. 2(B), the delaminated wafer is dipped into hydrofluoric acid to remove the oxide film 3 on the surface. HF 50% aqueous solution was used as hydrofluoric acid. The peripheral shape of the delaminated wafer wherein the oxide film was removed was measured again by scanning with a contact probe type roughness meter. The result was shown in FIG. 3(B).

As shown in FIG. 3(B), there is a step which is slightly higher than thickness of the SOI layer (0.2 micron) in the peripheral part of the delaminated wafer 5.

The delaminated wafer after removal of the oxide film was subjected to polishing to remove the peripheral step as shown in FIG. 2(C). Polishing was performed under the similar condition with the similar apparatus to those for general polishing of a silicon wafer. In the present invention, the delaminated surface was polished by inserting the delaminated wafer between polishing turn tables, rotating the polishing turn tables in such way that each of the polishing turn tables rotates in opposite direction each other, with loading at 500 g/cm$^2$ and with supplying a polishing slurry to the delaminated surface to be polished.

Figure 4:
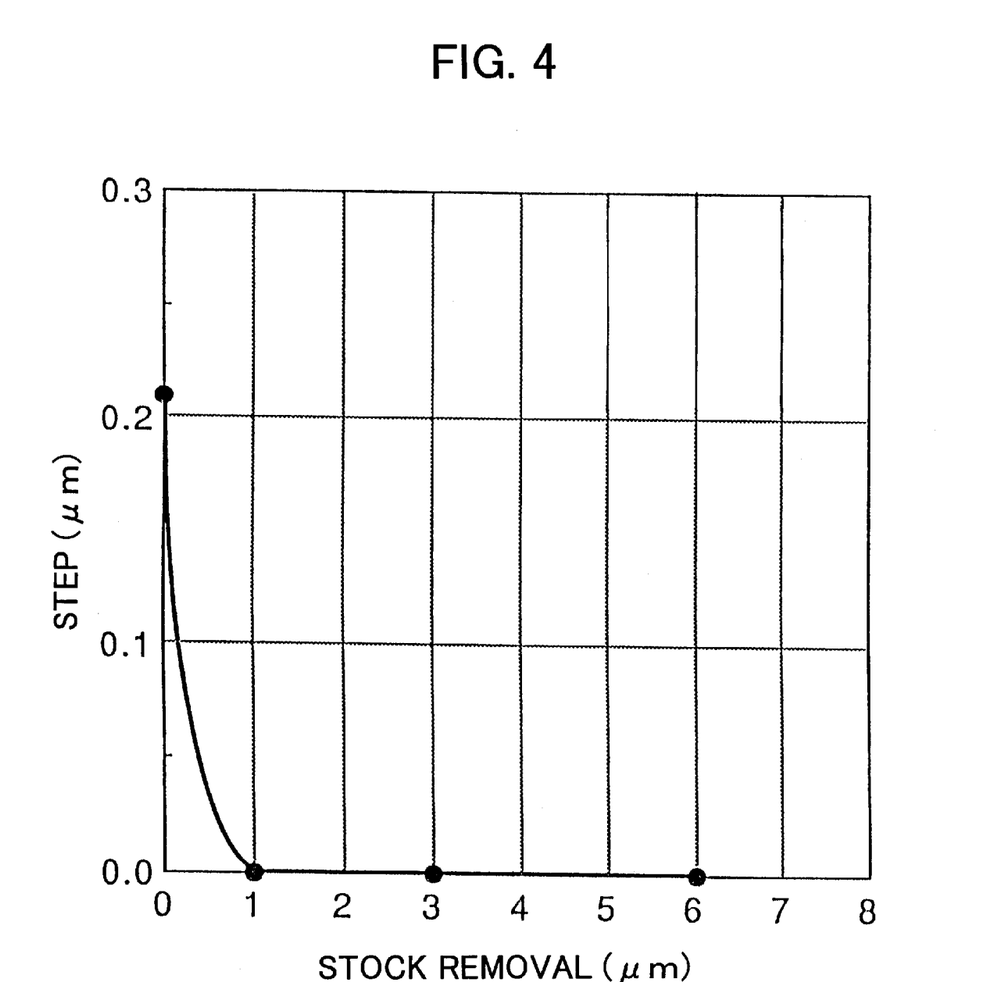
FIG. 4 is a graph showing a relation between stock removal in polishing for removal of a peripheral step and height of the step.

The result of the measurement as for the relation between the polishing stock removal and height of the peripheral step was shown in FIG. 4. As shown in FIG. 4, it is apparent that a stock removal of about 1 micron is enough to remove the steps completely. When the SOI layer is thicker and the step is higher, a stock removal of 2 micron will be preferable for perfection.

The shape of the peripheral part of the delaminated wafer wherein the peripheral step was removed by being polished to a stock removal of 1 micron was measured again by scanning with a contact probe type roughness meter. The result was shown in FIG. 3(C).

As shown in FIG. 3(C), the step in the peripheral part of the delaminated wafer was completely removed by being polished to a stock removal of 1 micron. Accordingly, the shape of the periphery of the wafer was suitable for reuse as a silicon wafer.

The delaminated wafer was subjected to cleaning before heat treatment as shown in FIG. 2(D) to prevent contamination thereof. The cleaning is well known as RCA cleaning, and comprises two steps: (aqueous ammonia/aqueous hydrogen peroxide) and (hydrochloric acid/aqueous hydrogen peroxide).

After the cleaning before heat treatment, the delaminated wafer was subjected to the heat treatment in a reducing atmosphere containing hydrogen through use of a rapid heating/rapid cooling apparatus shown in FIG. 6 under the following condition: in hydrogen 100% atmosphere, at 1200° C., for 30 seconds (FIG. 2(E))

The surface roughness of the delaminated surface after the heat treatment with a rapid heating/rapid cooling apparatus as measured by a phase shift interferometry method at 250 microns square and by atomic force microscope method at 1 micron square was 0.25 nm on the average and 0.20 nm on the average respectively (RMS value: root mean square roughness).

The values are equivalent to those value of the general mirror polished silicon wafer. Accordingly, it is apparent that the surface roughness was significantly improved.

After the heat treatment with rapid heating/rapid cooling apparatus, OSF density on the surface as measured by subjecting the wafer to oxidation and preferential etching and being observed with a microscope was about 10 numbers/$cm^2$, which is equivalent to the density of OSF generated in an epitaxial layer due to influence of the substrate.

As described above, the delaminated wafer reprocessed according to the present invention has a quality good enough for reuse as an epitaxial wafer again.

Accordingly, the reprocessed delaminated wafer was used as a bond wafer as shown in FIG. 2(F). Namely, the above-mentioned recycle (reclaimed) wafer was used as a bond wafer 2 in FIG. 1(a). As the delaminated wafer was made only 1 micron thinner by being polished to remove a peripheral step, it still has a thickness of about 9 microns. Then, the steps shown in FIG. 1 was performed to prepare SOI wafer in accordance with hydrogen ion delaminating method. High quality SOI wafer wherein SOI layer consists of the epitaxial layer could be obtained without any problems.

Then, in order to determine the effect of improvement in damage layer and the surface roughness achieved by the heat treatment in a reducing atmosphere containing hydrogen, the delaminated wafer wherein the oxide film was removed as shown in FIG. 2(B) but the polishing for removing the peripheral step was not performed, namely the delaminated wafer having the damage layer and the surface roughness on the delaminated surface, was subjected to RCA cleaning described above and then directly to the above mentioned heat treatment in a reducing atmosphere containing hydrogen through use of the rapid heating/rapid cooling apparatus shown in FIG. 6 under the following condition: in hydrogen 100% atmosphere, at 1200° C., for 30 seconds.

In order to determine the depth of a damage layer after the heat treatment, the wafers which are different from each other in etched thickness on the surface thereof were subjected to oxidation and preferential etching, and observed with a microscope to measure a density of OSF existing on the surface of each wafer. Each etching removal was 0, 25, 50, 75, 100, 150, 200 nm. The results of measurement was shown as a curved line b in FIG. 5.

As shown in FIG. 5, it is apparent that, even though polishing was not performed, the damage layer on the surface of the delaminated wafer after the heat treatment in a reducing atmosphere containing hydrogen was removed.

The surface roughness of the delaminated layer after the heat treatment with a rapid heating/rapid cooling apparatus as measured by a phase shift interferometry method at 250 microns square and by atomic force microscope method at 1 micron square was 0.32 nm on the average and 0.21 nm on the average respectively (RMS value: root mean square roughness).

The values are equivalent to those of the general mirror polished silicon wafer. Accordingly, it is apparent that the surface roughness was significantly improved.

Accordingly, it is apparent that the order of the step of polishing for removing the peripheral step as shown in step (C) of FIG. 2 and the step of heat treatment in a reducing atmosphere containing hydrogen as shown in steps (D) and (E) of FIG. 2 can be changed.

The present invention is not limited to the above-described embodiment. The above-described embodiment is a mere example, and those having the substantially same structure as that described in the appended claims and providing the similar action and effects are included in the scope of the present invention.

For example, the above description of the present invention has focused on the case where two silicon wafers are bonded to obtain an SOI wafer. However, the present invention is not limited to the embodiment. For example, the present invention is applicable to reprocessing of a delaminated wafer produced as by-product in the case where a silicon wafer after ion implantation thereinto is bonded to an insulator wafer; and a portion of the ion-implanted wafer is delaminated to thereby obtain an SOI wafer.

Furthermore, the processes of reprocessing the delaminated wafer according to the present invention are not limited to that shown in FIG. 2. Other processes such as cleaning, heat treatment or the like can be added thereto. Furthermore, the order of the processes can be partly changed or any of the processes can be omitted depending on the purpose.

What is claimed is:

1. A method of recycling a delaminated wafer produced as a by-product in producing an SOI wafer by reprocessing it for reuse as a silicon wafer, wherein the delaminated wafer is obtained according to a hydrogen ion delaminating method in which hydrogen ions or rare gas ions are implanted into the surface of a silicon wafer to be used as a bond wafer in order to form a fine bubble layer within the wafer, the ion-implanted silicon wafer is superposed on a base wafer such that the ion-implanted surface comes into close contact with the surface of the base wafer, heat treatment is performed to delaminate a portion of the ion-implanted wafer while the fine bubble layer is used as a delaminating plane, and wherein at least polishing of the delaminated wafer for removing of a step in the peripheral part of the delaminated wafer and heat treatment in a reducing atmosphere containing hydrogen are conducted as the reprocessing.

2. A method of recycling a delaminated wafer according to claim 1, wherein the bond wafer is a CZ wafer, an epitaxial wafer, or an FZ wafer.

3. The method of recycling a delaminated wafer according to claim 1, wherein a surface oxide film is removed before polishing for removal of a step in the peripheral part, as the reprocessing.

4. The method of recycling a delaminated wafer according to claim 2, wherein a surface oxide film is removed before polishing for removal of a step in the peripheral part, as the reprocessing.

5. The method of recycling a delaminated wafer according to claim 1, wherein a stock removal in the polishing for removal of the step in the peripheral part as the reprocessing is 1 to 2 microns.

6. The method of recycling a delaminated wafer according to claim 2, wherein a stock removal in the polishing for removal of the step in the peripheral part as the reprocessing is 1 to 2 microns.

7. The method of recycling a delaminated wafer according to claim 1, wherein the heat treatment in a reducing atmosphere containing hydrogen as the reprocessing is performed at a temperature in the range from 1000° C. to a melting point of silicon, for 6 hours or less.

8. The method of recycling a delaminated wafer according to claim 2, wherein the heat treatment in a reducing atmosphere containing hydrogen as the reprocessing is performed at a temperature in the range from 1000° C. to a melting point of silicon, for 6 hours or less.

9. The method of recycling a delaminated wafer according to claim 1, wherein the heat treatment in a reducing atmosphere containing hydrogen as the reprocessing is performed at a temperature in the range from 1000° C. to a melting point of silicon for 1 to 300 seconds through use of a rapid heating/rapid cooling apparatus.

10. The method of recycling a delaminated wafer according to claim 2, wherein the heat treatment in a reducing atmosphere containing hydrogen as the reprocessing is performed at a temperature in the range from 1000° C. to a melting point of silicon for 1 to 300 seconds through use of a rapid heating/rapid cooling apparatus.

11. The method of recycling a delaminated wafer according to claim 1, wherein said heat treatment in a reducing atmosphere containing hydrogen as the reprocessing is performed in 100% hydrogen atmosphere or a mixed atmosphere of hydrogen and argon.

12. The method of recycling a delaminated wafer according to claim 2, wherein said heat treatment in a reducing atmosphere containing hydrogen as the reprocessing is performed in 100% hydrogen atmosphere or a mixed atmosphere of hydrogen and argon.

13. The method of recycling a delaminated wafer, wherein the delaminated wafer reprocessed by the method according to claim 1 is reused as a bond wafer of an SOI wafer.

14. The method of recycling a delaminated wafer, wherein the delaminated wafer reprocessed by the method according to claim 2 is reused as a bond wafer of an SOI wafer.

* * * * *